United States Patent
Richmond et al.

(10) Patent No.: US 11,579,645 B2
(45) Date of Patent: Feb. 14, 2023

(54) DEVICE DESIGN FOR SHORT-CIRCUITRY PROTECTION CIRCUITRY WITHIN TRANSISTORS

(71) Applicant: Wolfspeed, Inc., Durham, NC (US)

(72) Inventors: James Richmond, Hillsborough, NC (US); Edward Robert Van Brunt, Raleigh, NC (US); Philipp Steinmann, Durham, NC (US)

(73) Assignee: Wolfspeed, Inc., Durham, NC (US)

( * ) Notice: Subject to any disclaimer, the term of this patent is extended or adjusted under 35 U.S.C. 154(b) by 262 days.

(21) Appl. No.: 16/448,538

(22) Filed: Jun. 21, 2019

(65) Prior Publication Data

US 2020/0401172 A1    Dec. 24, 2020

(51) Int. Cl.
G05F 1/569        (2006.01)
G01R 31/50       (2020.01)
G05F 3/20         (2006.01)
H01L 29/16       (2006.01)

(52) U.S. Cl.
CPC .............. *G05F 1/569* (2013.01); *G01R 31/50* (2020.01); *G05F 3/20* (2013.01); *H01L 29/1608* (2013.01)

(58) Field of Classification Search
CPC .............................................. H02H 9/04–046
See application file for complete search history.

(56) References Cited

U.S. PATENT DOCUMENTS

| | | | | |
|---|---|---|---|---|
| 4,760,434 A | * | 7/1988 | Tsuzuki | H01L 23/34 |
| | | | | 257/470 |
| 4,893,159 A | * | 1/1990 | Suzuki | H01L 27/0251 |
| | | | | 257/360 |
| 5,119,162 A | * | 6/1992 | Todd | H01L 21/823456 |
| | | | | 257/370 |
| 5,311,391 A | * | 5/1994 | Dungan | H02H 9/046 |
| | | | | 361/56 |

(Continued)

FOREIGN PATENT DOCUMENTS

| | | |
|---|---|---|
| EP | 0224274 A2 | 6/1987 |
| EP | 0702455 A2 * | 3/1996 ....... H03K 17/08122 |

(Continued)

OTHER PUBLICATIONS

International Search Report and Written Opinion for International Patent Application No. PCT/US2020/036251, dated Sep. 1, 2020, 14 pages.

*Primary Examiner* — Thienvu V Tran
*Assistant Examiner* — Nusrat Quddus
(74) *Attorney, Agent, or Firm* — Myers Bigel, P.A.

(57) ABSTRACT

A transistor semiconductor die includes a first current terminal, a second current terminal, and a control terminal. A semiconductor structure is between the first current terminal, the second current terminal, and the control terminal and configured such that a resistance between the first current terminal and the second current terminal is based on a control signal provided at the control terminal. Short circuit protection circuitry is coupled between the control terminal and the second current terminal. In a normal mode of (Continued)

operation, the short circuit protection circuitry is configured to provide a voltage drop that is greater than a voltage of the control signal. In a short circuit protection mode of operation, the short circuit protection circuitry is configured to provide a voltage drop that is less than a voltage of the control signal.

26 Claims, 11 Drawing Sheets

(56) References Cited

U.S. PATENT DOCUMENTS

| | | | | |
|---|---|---|---|---|
| 5,691,557 | A * | 11/1997 | Watanabe | H01L 27/0251 257/357 |
| 5,754,074 | A * | 5/1998 | Kelly | H03K 17/08122 327/434 |
| 5,825,603 | A * | 10/1998 | Parat | H02H 9/046 361/111 |
| 5,886,543 | A * | 3/1999 | Moody | H03K 17/687 327/77 |
| 5,978,192 | A * | 11/1999 | Young | H02H 9/046 361/111 |
| 8,437,109 | B1 * | 5/2013 | Wu | H02H 9/041 361/91.1 |
| 8,743,518 | B1 * | 6/2014 | Ozard | H02H 9/046 361/56 |
| 9,136,381 | B1 * | 9/2015 | Kocon | H01L 29/7803 |
| 9,349,721 | B2 * | 5/2016 | Saito | H01L 29/7804 |
| 9,786,778 | B1 * | 10/2017 | Morizuka | H01L 29/1608 |
| 9,887,287 | B1 * | 2/2018 | Lichtenwalner | H01L 29/4236 |
| 9,998,109 | B1 * | 6/2018 | Das | H03K 17/107 |
| 10,026,728 | B1 * | 7/2018 | Agam | H01L 29/1095 |
| 10,529,812 | B1 * | 1/2020 | Edwards | H01L 21/823475 |
| 10,879,692 | B2 * | 12/2020 | Kubo | H02H 9/041 |
| 10,950,596 | B2 * | 3/2021 | Zeng | H01L 29/7397 |
| 11,322,610 | B2 * | 5/2022 | Kim | H03K 17/122 |
| 2002/0018330 | A1 * | 2/2002 | Bremond | H02H 9/042 361/103 |
| 2003/0141918 | A1 * | 7/2003 | Uno | H02H 9/041 327/309 |
| 2004/0084753 | A1 * | 5/2004 | Fruth | H01L 29/7395 257/E29.198 |
| 2005/0122748 | A1 | 6/2005 | Tadokoro et al. | |
| 2005/0167742 | A1 * | 8/2005 | Challa | H01L 29/7806 257/E29.264 |
| 2006/0113593 | A1 * | 6/2006 | Sankin | H01L 29/872 257/341 |
| 2006/0284276 | A1 * | 12/2006 | Yilmaz | H01L 29/0653 257/E29.328 |
| 2007/0168638 | A1 * | 7/2007 | Hepkin | G06F 12/121 711/203 |
| 2008/0258224 | A1 * | 10/2008 | Hshieh | H01L 27/0629 438/237 |
| 2009/0195947 | A1 * | 8/2009 | Ootsuka | H02H 9/046 361/56 |
| 2010/0001783 | A1 * | 1/2010 | Ronsisvalle | H01L 29/742 327/438 |
| 2011/0049564 | A1 * | 3/2011 | Guan | H01L 29/872 257/329 |
| 2011/0073906 | A1 * | 3/2011 | Bobde | H01L 29/7811 257/329 |
| 2011/0127586 | A1 * | 6/2011 | Bobde | H01L 29/7817 438/192 |
| 2012/0007138 | A1 * | 1/2012 | Nguyen | H02H 9/046 257/134 |
| 2012/0120531 | A1 * | 5/2012 | Abou-Khalil | H02H 9/046 361/56 |
| 2012/0193676 | A1 * | 8/2012 | Bobde | H01L 29/7391 257/140 |
| 2012/0292636 | A1 * | 11/2012 | Zhang | H01L 29/732 257/77 |
| 2013/0026493 | A1 * | 1/2013 | Cheng | H01L 29/36 257/77 |
| 2013/0063846 | A1 * | 3/2013 | Pierco | H01L 27/0259 361/56 |
| 2013/0146971 | A1 * | 6/2013 | Hirler | H01L 27/0255 257/334 |
| 2013/0314833 | A1 * | 11/2013 | Smith | H02H 7/20 361/91.6 |
| 2014/0111893 | A1 * | 4/2014 | Kato | H02H 9/046 361/56 |
| 2014/0138737 | A1 * | 5/2014 | Bobde | H01L 29/7396 257/329 |
| 2014/0177113 | A1 * | 6/2014 | Gueorguiev | H01L 29/7816 361/56 |
| 2014/0268443 | A1 * | 9/2014 | Nassar | H02H 9/04 361/56 |
| 2014/0332877 | A1 * | 11/2014 | Noebauer | H01L 27/0251 257/328 |
| 2015/0021659 | A1 * | 1/2015 | Rountree | H01L 21/82 257/146 |
| 2015/0028351 | A1 * | 1/2015 | Van Brunt | H01L 29/7802 257/77 |
| 2015/0084118 | A1 * | 3/2015 | Van Brunt | H01L 29/7806 438/237 |
| 2015/0084125 | A1 * | 3/2015 | Pala | H01L 29/66734 257/334 |
| 2015/0138678 | A1 * | 5/2015 | Parthasarathy | H02H 9/005 361/56 |
| 2015/0162321 | A1 * | 6/2015 | Briere | H03K 17/102 257/195 |
| 2016/0043169 | A1 * | 2/2016 | Guan | H01L 29/0619 438/237 |
| 2016/0163689 | A1 * | 6/2016 | Laven | H01L 29/7805 257/334 |
| 2016/0181391 | A1 * | 6/2016 | Bobde | H01L 29/66136 438/270 |
| 2016/0247799 | A1 * | 8/2016 | Stafanov | H01L 27/0727 |
| 2016/0285255 | A1 * | 9/2016 | O'Donnell | H02H 9/046 |
| 2017/0054360 | A1 * | 2/2017 | Uemura | H02M 7/5387 |
| 2017/0149430 | A1 * | 5/2017 | Dupuy | H01L 29/407 |
| 2017/0194438 | A1 * | 7/2017 | Kumagai | H01L 29/1095 |
| 2017/0200785 | A1 * | 7/2017 | Janssens | H01L 27/088 |
| 2017/0256938 | A1 * | 9/2017 | Fukuhara | H02H 9/04 |
| 2017/0338809 | A1 * | 11/2017 | Stefanov | H03K 17/102 |
| 2017/0345891 | A1 * | 11/2017 | Van Brunt | H01L 29/0634 |
| 2017/0373491 | A1 * | 12/2017 | Schork | H02H 9/041 |
| 2018/0114788 | A1 * | 4/2018 | Ahlers | H01L 29/7803 |
| 2018/0166994 | A1 * | 6/2018 | Dorn | H02M 5/293 |
| 2018/0269313 | A1 * | 9/2018 | Bina | H01L 29/423 |
| 2018/0301553 | A1 * | 10/2018 | Weyers | H01L 27/0255 |
| 2018/0350797 | A1 * | 12/2018 | Lee | H02H 9/046 |
| 2018/0366569 | A1 * | 12/2018 | Zeng | H01L 29/7783 |
| 2019/0067174 | A1 * | 2/2019 | Seok | H01L 25/18 |
| 2019/0067493 | A1 * | 2/2019 | Seok | H01L 29/0619 |
| 2019/0131964 | A1 * | 5/2019 | Bryant | H03K 17/74 |
| 2019/0198666 | A1 * | 6/2019 | Kim | H01L 21/28035 |
| 2019/0287959 | A1 * | 9/2019 | Hua | H01L 27/0262 |
| 2019/0393334 | A1 * | 12/2019 | Weyers | H01L 29/7804 |
| 2020/0035669 | A1 * | 1/2020 | Tamaru | H01L 29/0865 |
| 2020/0169079 | A1 * | 5/2020 | Smith | H01L 27/0266 |
| 2020/0212664 | A1 * | 7/2020 | Takuma | H03K 17/145 |
| 2020/0335493 | A1 * | 10/2020 | Arnold | H01L 29/861 |
| 2020/0343721 | A1 * | 10/2020 | Parthasarathy | H02H 9/041 |
| 2021/0193646 | A1 * | 6/2021 | Zeng | H01L 27/0255 |
| 2022/0044982 | A1 * | 2/2022 | Mongin | H01L 23/34 |
| 2022/0102487 | A1 * | 3/2022 | Siemieniec | H01L 27/0255 |

FOREIGN PATENT DOCUMENTS

| | | | | |
|---|---|---|---|---|
| EP | 1041634 A1 * | 10/2000 | | H01L 29/7813 |
| EP | 1063757 A2 | 12/2000 | | |
| EP | 3419170 A1 | 12/2018 | | |

* cited by examiner

DEVICE DESIGN FOR SHORT-CIRCUITRY PROTECTION CIRCUITRY WITHIN TRANSISTORS

FIELD OF THE DISCLOSURE

The present disclosure is related to transistor semiconductor die, and in particular to transistor semiconductor die with improved protection against short circuit events.

BACKGROUND

Transistor devices such as metal-oxide semiconductor field-effect transistors (MOSFETs), insulated gate bipolar transistors (IGBTs), junction field-effect transistors (JFETs), and bipolar junction transistors (BJTs) are often used in power electronics, in which they may be used to selectively deliver current to and from a load. In certain situations, a load may provide a short circuit across a transistor device. Such a short circuit event may cause the transistor device to fail.

In recent years, there has been a push towards using wide bandgap semiconductor material systems for devices used in power electronics. For example, silicon carbide transistors are now in widespread use in power electronics. Compared to their silicon counterparts, silicon carbide transistors provide better performance, for example, by providing higher blocking voltage, lower on-state resistance, and lower switching loss. Silicon carbide transistors are also much smaller in size, and thus have higher current density. Accordingly, the short circuit withstand time, or the amount of time that a device can survive without failure during a short circuit event, of a silicon carbide transistor is much lower than that of a similar silicon device.

In light of the above, there is a present need for silicon carbide transistor devices with improved short circuit protection.

SUMMARY

In one embodiment, a transistor semiconductor die includes a first current terminal, a second current terminal, and a control terminal. A semiconductor structure is between the first current terminal, the second current terminal, and the control terminal and configured such that a resistance between the first current terminal and the second current terminal is based on a control signal provided at the control terminal. Short circuit protection circuitry is coupled between the control terminal and the second current terminal. In a normal mode of operation, the short circuit protection circuitry is configured to provide a voltage drop between the control terminal and the second current terminal that is greater than a voltage of the control signal. In a short circuit protection mode of operation, the short circuit protection circuitry is configured to provide a voltage drop between the control terminal and the second current terminal that is less than a voltage of the control signal. Accordingly, the short circuit protection circuit is configured to protect the transistor semiconductor die from failure due to a short circuit condition while not interfering with the operation of the transistor semiconductor die in a normal mode of operation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
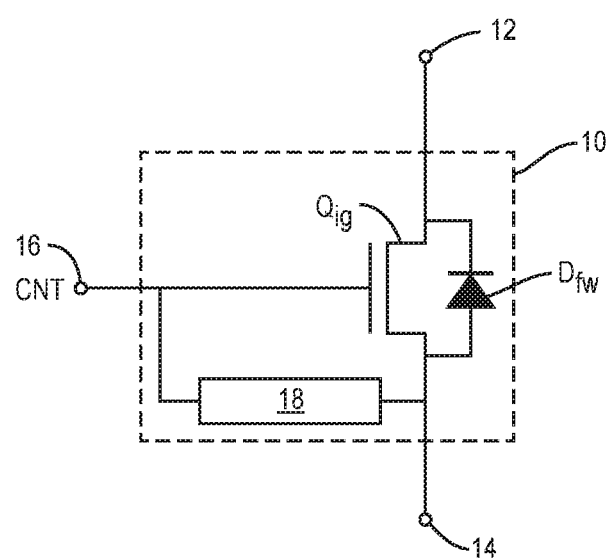
FIG. 1 is a schematic representation of a transistor semiconductor die according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a schematic representation of a transistor semiconductor die 10 according to one embodiment of the present disclosure. The transistor semiconductor die 10 includes a first current terminal 12, a second current terminal 14, and a control terminal 16. A semiconductor structure between the first current terminal 12, the second current terminal 14, and the control terminal 16 forms a transistor device $Q_{ig}$ such that a resistance between the first current terminal 12 and the second current terminal 14 is based on a control signal CNT provided at the control terminal 16. As shown in FIG. 1, the transistor device $Q_{ig}$ is a metal-oxide semiconductor field-effect transistor (MOSFET). Accordingly, the first current terminal 12 is a drain terminal, the second current terminal 14 is a source terminal, and the control terminal 16 is a gate terminal. However, the principles of the present disclosure apply equally to any transistor device such as an insulated gate bipolar transistor (IGBT). In the case of an IGBT, the first current terminal 12 is a collector terminal, the second current terminal 14 is an emitter terminal, and the control terminal 16 is a gate terminal. Since the transistor device $Q_{ig}$ may be used for power electronics, a freewheeling anti-parallel diode $D_{fw}$ may be coupled in anti-parallel with the transistor device $Q_{ig}$ so that current can be conducted bidirectionally between the first current terminal 12 and the second current terminal 14. In various embodiments, the freewheeling diode $D_{fw}$ may be external from the transistor device $Q_{ig}$, or may be internal to the transistor device $Q_{ig}$, e.g., a body diode.

While the transistor device $Q_{ig}$ is shown herein as an insulated gate device, the principles of the present disclosure apply equally to any transistor device such as bipolar junction transistors (BJTs), and junction field-effect transistors (JFETs). In the case of a BJT, the first current terminal 12 is a collector terminal, the second current terminal 14 is an emitter terminal, and the control terminal 16 is a base terminal. In the case of a JFET, the first current terminal 12 is a drain terminal, the second current terminal 14 is a source terminal, and the control terminal 16 is a gate terminal. Further, the transistor device $Q_{ig}$ may be a thyristor. In the case of a thyristor, the first current terminal 12 is an anode, the second current terminal 14 is a cathode, and the control terminal 16 is a gate terminal.

The transistor semiconductor die 10 may utilize a wide bandgap material system such as silicon carbide. As discussed above, the silicon carbide transistor semiconductor die 10 may be more sensitive to short circuit events than their silicon counterparts due to the smaller size and higher current density thereof. Accordingly, short circuit protection circuitry 18 is coupled between the control terminal 16 and the second current terminal 14. The short circuit protection circuitry 18 is configured to operate in a normal mode of operation and a short circuit protection mode of operation. In the normal mode of operation, the short circuit protection circuitry 18 is configured to provide a voltage drop between the control terminal 16 and the second current terminal 14 that is greater than a voltage of the control signal CNT. In the short circuit protection mode of operation, the short circuit protection circuitry 18 is configured to provide a voltage drop between the control terminal 16 and the second current terminal 14 that is less than a voltage of the control signal CNT. In the normal mode of operation when a voltage drop across the short circuit protection circuitry 18 is greater than a voltage of the control signal CNT, the operation of the transistor device $Q_{ig}$ is relatively unaffected. In the short circuit protection mode of operation when a voltage drop across the short circuit protection circuitry 18 is less than a voltage of the control signal CNT, a voltage at the control terminal 16 is lowered such that voltage between the control terminal 16 and the second current terminal 14 (i.e., the gate-to-source voltage of the transistor device $Q_{ig}$) is reduced, which in turn partially or completely shuts off the device. Shutting off the transistor device $Q_{ig}$ protects the device during a short circuit event in order to prevent a failure.

One way in which the above-mentioned functionality may be accomplished is by providing the short circuit protection circuitry 18 such that it has a negative temperature coefficient with respect to a voltage drop across the short circuit protection circuitry 18. In other words, the short circuit protection circuitry 18 may be provided such that a voltage drop across the short circuit protection circuitry 18 decreases as temperature increases. Since during a short circuit event a temperature of the transistor semiconductor die 10 will rapidly increase far above normal operating temperatures thereof, the short circuit protection circuitry 18 may significantly reduce a voltage drop between the control terminal 16 and the second current terminal 14 only when a short circuit event occurs. Note that this functionality requires adequate thermal coupling between the short circuit protection circuitry 18 and the current carrying portion of the transistor semiconductor die 10.

Notably, the short circuit protection circuitry 18 is located on the transistor semiconductor die 10. As discussed in detail below, the short circuit protection circuitry 18 takes up minimal area on the transistor semiconductor die 10 and may be capable of extending a short circuit withstand time of the transistor semiconductor die 10 significantly, and in some cases indefinitely.

Figure 2:
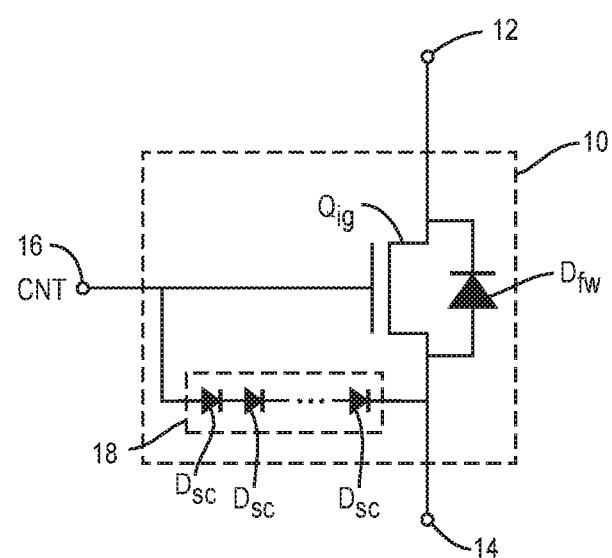
FIG. 2 is a schematic representation of a transistor semiconductor die according to one embodiment of the present disclosure.

FIG. 2 is a schematic representation of the transistor semiconductor die 10 showing details of the short circuit protection circuitry 18 according to one embodiment of the present disclosure. As shown in FIG. 2, the short circuit protection circuitry 18 may include a number of short circuit protection diodes $D_{sc}$ coupled in series between the control terminal 16 and the second current terminal 14. In particular, the short circuit protection diodes $D_{sc}$ are coupled anode-to-cathode between the control terminal 16 and the second current terminal 14 such that an anode of a first one of the short circuit protection diodes $D_{sc}$ is coupled to the control terminal 16 and a cathode of a last one of the short circuit protection diodes $D_{sc}$ is coupled to the second current terminal 14. As discussed above, the short circuit protection diodes $D_{sc}$ may be provided with a negative temperature coefficient (e.g., an exponential negative temperature coefficient) with respect to a forward voltage drop thereof. In other words, the short circuit protection diodes $D_{sc}$ may be provided such that a forward voltage drop across the diodes decreases as temperature increases. Such a negative temperature coefficient is naturally present in silicon carbide diodes. The negative temperature coefficient enables a voltage drop across the short circuit protection diodes $D_{sc}$ to be greater than a voltage of the control signal CNT in the normal mode of operation (and thus not interfere with the operation of the transistor device $Q_{ig}$) and be less than a voltage of the control signal CNT in the short circuit protection mode of operation (thus partially or completely turning off the transistor device $Q_{ig}$). Note that this functionality requires adequate thermal coupling between the short circuit protection circuitry 18 and the current carrying portion of the transistor semiconductor die 10. The number of short circuit protection diodes $D_{sc}$ may be chosen such that when a temperature of the transistor semiconductor die 10 is below a short circuit threshold temperature a voltage drop across the short circuit protection diodes $D_{sc}$ is greater than or equal to a voltage of the control signal CNT and when a temperature of the transistor semiconductor die 10 is above the short circuit threshold temperature a voltage drop across the short circuit protection diodes $D_{sc}$ is significantly less than the voltage of the control signal CNT such that a voltage at the control terminal 16 is lowered enough to partially or completely turn off the transistor device $Q_{ig}$.

In addition to protecting the transistor device $Q_{ig}$ against short circuit events, the short circuit protection circuitry 18 also clamps the maximum voltage of the gate to the combined forward voltage drop of the short circuit protection diodes $D_{sc}$. This has the additional benefits of protecting the transistor device $Q_{ig}$ against electrostatic discharge (ESD) and provides voltage overshoot protection for the gate of the transistor device $Q_{ig}$.

The short circuit protection circuitry 18 may enable significant improvements in the short circuit withstand time of the transistor semiconductor die 10. As discussed herein, the short circuit protection circuitry 18 may require minimal active area on the transistor semiconductor die 10. In various embodiments, an on-state resistance of the transistor semiconductor die 10 may be between 0.1 mΩ/cm² and 3.0 mΩ/cm², a blocking voltage of the transistor semiconductor die 10 may be between 600V and 10 kV, and a short circuit withstand time of the transistor semiconductor die 10 may be greater than 3 μs. Notably, the on-state resistance of the transistor semiconductor die 10 may fall anywhere in the above range, such as between 0.5 mΩ/cm² and 3.0 mΩ/cm², between 1.0 mΩ/cm² and 3.0 mΩ/cm², between 1.5 mΩ/cm² and 3.0 mΩ/cm², between 2.0 mΩ/cm² and 3.0 mΩ/cm², between 2.5 mΩ/cm² and 3.0 mΩ/cm², and the like. The blocking voltage of the transistor semiconductor die 10 may similarly fall anywhere inside the above range, such as between 600V and 1 kV, between 600V and 2 kV, between 600V and 5 kV, between 1 kV and 5 kV, between 5 kV and 10 kV, and the like. A relationship between the on-state resistance and the blocking voltage of the transistor semiconductor die 10 may be expressed according to Equation (1):

$$R_{on} = 0.8 \times (3 \times 10^{-8}) \times V_{block}^{2.4} \quad (1)$$

where $R_{on}$ is the on-state resistance of the transistor semiconductor die and $V_{block}$ is the blocking voltage of the transistor semiconductor die 10.

The short circuit withstand time of the transistor semiconductor die 10 may be less than 10 s in some embodiments, but the principles of the present disclosure may also enable the transistor semiconductor die 10 to indefinitely withstand a short circuit event in some circumstances. The short circuit withstand time of the transistor semiconductor die 10 may fall anywhere in the above ranges such that the short circuit withstand time is between 4 μs and 10 s, between 5 μs and 10 s, between 10 μs and 10 s, between 50 μs and 10 s, between 5 ms and 10 s, between 10 ms and 10 s, between 50 ms and 10 s, between 1 s and 10 s, and the like.

Figure 3:
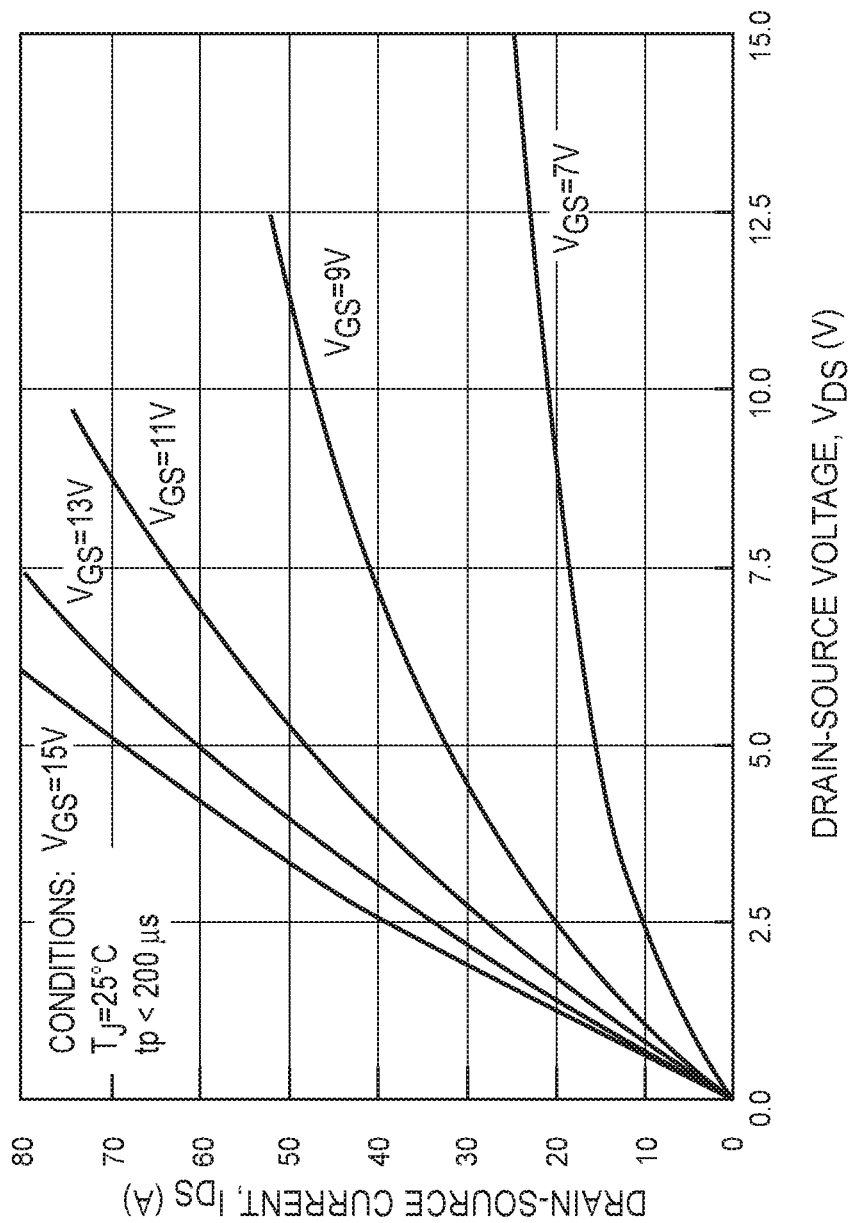
FIG. 3 is a graph illustrating a relationship between drain-source voltage, drain-source current, and gate-source voltage for a metal-oxide semiconductor field-effect transistor (MOSFET) according to one embodiment of the present disclosure.

FIG. 3 is a graph illustrating a relationship between drain-source voltage, drain-source current, and gate-source voltage in a MOSFET. As shown, a relationship between drain-source voltage and drain-source current is dependent on gate-source voltage such that as the gate-source voltage increases, a steepness of the curve between drain-source voltage and drain-source current increases. Accordingly, higher gate-source voltages will lead to higher drain-source currents during a short circuit event. When a drain-source current becomes high enough, the device will fail. By reducing the gate-source voltage during a short circuit event, the drain-source current is significantly reduced such that a failure of the device can be prevented.

Figure 4:
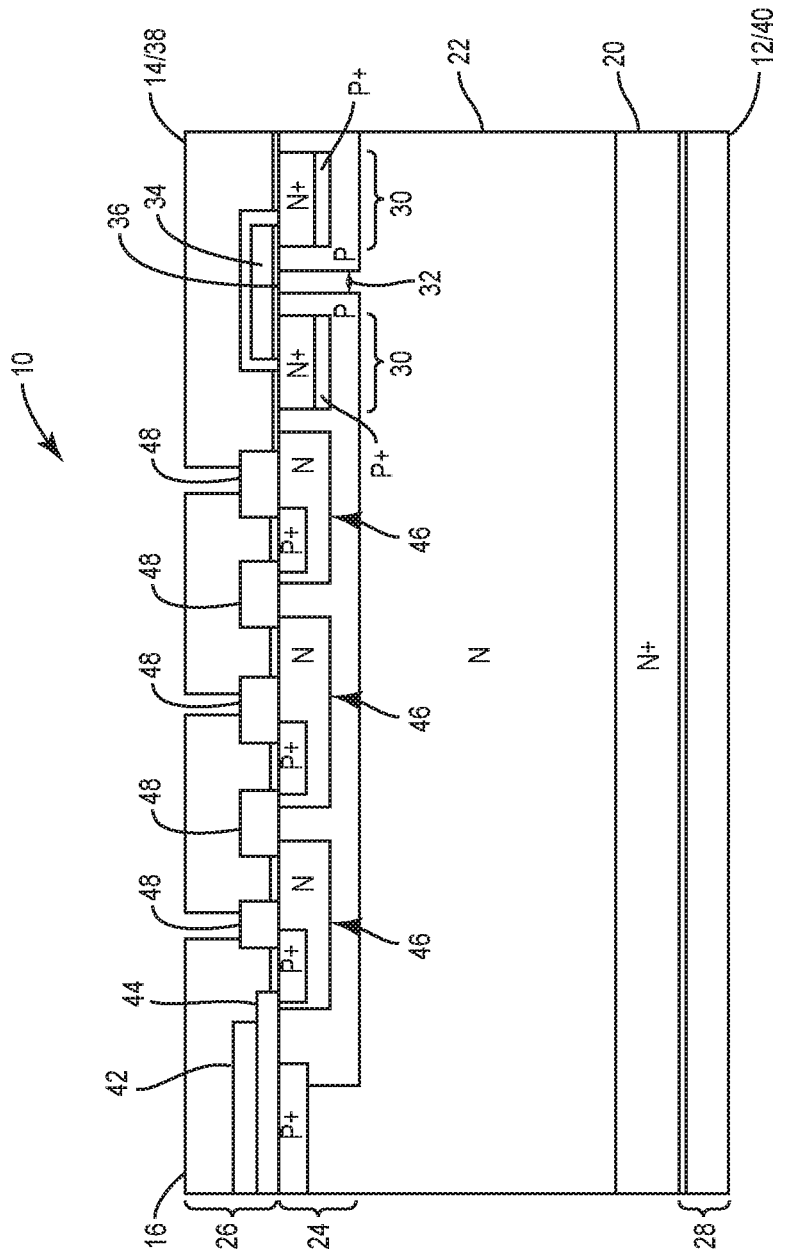
FIG. 4 is a cross-sectional view of a portion of a transistor semiconductor die according to one embodiment of the present disclosure.

FIG. 4 is a cross-sectional view of a portion of the transistor semiconductor die 10 according to one embodiment of the present disclosure. The transistor semiconductor die 10 includes a substrate 20, a drift layer 22 on the substrate 20, a number of implants 24 in the drift layer 22, a top metallization layer 26, and a bottom metallization layer 28. In particular, on the right side of the transistor semiconductor die 10 the transistor device $Q_{ig}$ is provided as a vertical MOSFET including a pair of junction implants 30 in the drift layer 22 such that the junction implants 30 are separated by a JFET gap 32. A gate contact 34 on top of a gate oxide layer 36 runs between the junction implants 30 on a surface of the drift layer 22 opposite the substrate 20. A source contact 38 (which may also be the second current terminal 14) also contacts each one of the junction implants 30 on the surface of the drift layer 22 opposite the substrate. A drain contact 40 (which may also be the first current terminal 12) is on the substrate 20 opposite the drift layer 22. The source contact 38 is provided by a portion of the top metallization layer 26. The drain contact 40 is provided by the bottom metallization layer 28.

On the left side of the transistor semiconductor die 10, the control terminal 16 is provided by a portion of the top metallization layer 26. While not shown, the control terminal 16 is coupled to the gate contact 34 of the transistor device $Q_{ig}$ on a plane not shown in the cross-section (e.g., via a gate runner 42 provided on a field oxide layer 44 below the top metallization layer 26). The control terminal 16 is also coupled to the source contact 38 of the transistor device $Q_{ig}$ through a number of P-N junctions 46 formed in the drift layer 22. Each one of these P-N junctions 46 forms one of the short circuit protection diodes $D_{sc}$ discussed above with respect to FIG. 2. The top metallization layer 26 is appropriately patterned to form connections between the control terminal 16 and the source contact 38 through the P-N junctions 46 as shown. An intermetal dielectric layer 48 may insulate different portions of the top metallization layer 26 to form the desired connection pattern.

While only one unit cell of the transistor device $Q_{ig}$ is shown in FIG. 4, the transistor device $Q_{ig}$ may comprise any number of cells coupled together to provide a desired forward current rating of the transistor semiconductor die 10. Further, while the short circuit protection diodes $D_{sc}$ are shown one next to another in the drift layer 22 in FIG. 4, the short circuit protection diodes $D_{sc}$ may be distributed in any suitable manner in the transistor semiconductor die 10. For example, the short circuit protection diodes $D_{sc}$ may be distributed between different cells of the transistor device $Q_{ig}$ in a pattern in order to reduce the total active area devoted to the short circuit protection diodes $D_{sc}$. In general, the short circuit protection diodes $D_{sc}$ will consume very little area when compared to the transistor device $Q_{ig}$ and thus will have a minimal impact on the total active area of the transistor semiconductor die 10.

Figure 5:
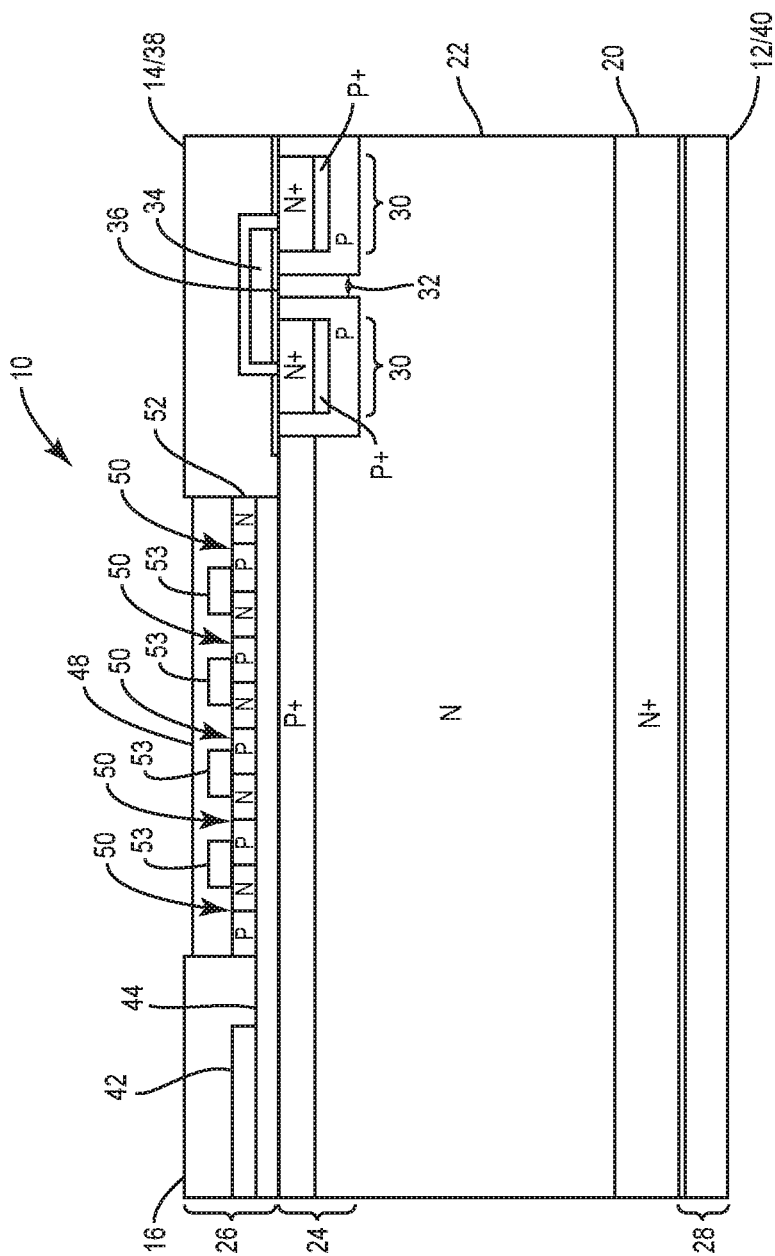
FIG. 5 is a cross-sectional view of a portion of a transistor semiconductor die according to one embodiment of the present disclosure.

FIG. 5 shows the transistor semiconductor die 10 according to an additional embodiment of the present disclosure. The transistor semiconductor die 10 shown in FIG. 5 is substantially similar to that shown in FIG. 4, except that the short circuit protection diodes $D_{sc}$ are provided as a number of P-N junctions 50 formed in an additional semiconductor layer 52 (e.g., a polysilicon layer) that is provided on the drift layer 22 (with the field oxide layer 44 between the additional semiconductor layer 52 and the drift layer 22 to avoid interaction between the layers). A number of metal jumpers 53 may be provided between each adjacent P-N junction 50. In the embodiment shown in FIG. 5 the short circuit protection diodes $D_{sc}$ may be Zener diodes. In such an embodiment, the short circuit protection diodes $D_{sc}$ are coupled in series cathode-to-anode between the insulted gate terminal 16 and the second current terminal 14 such that a cathode of a first one of the short circuit protection diodes $D_{sc}$ is coupled to the control terminal 16 and an anode of a last one of the short circuit protection diodes $D_{sc}$ is coupled to the second current terminal 14. However, the P-N junctions 50 in FIG. 5 may be reversed such that they are coupled anode-to-cathode between the insulated gate terminal 16 and the second current terminal 14 as shown. Providing the short circuit protection diodes $D_{sc}$ in the additional semiconductor layer 52 that is provided on the drift layer 22 may allow a reduction or elimination of the active area devoted to the short circuit protection circuitry 18, since the short circuit protection diodes $D_{sc}$ can be moved over the transistor device $Q_{ig}$ in some embodiments.

Figure 6:
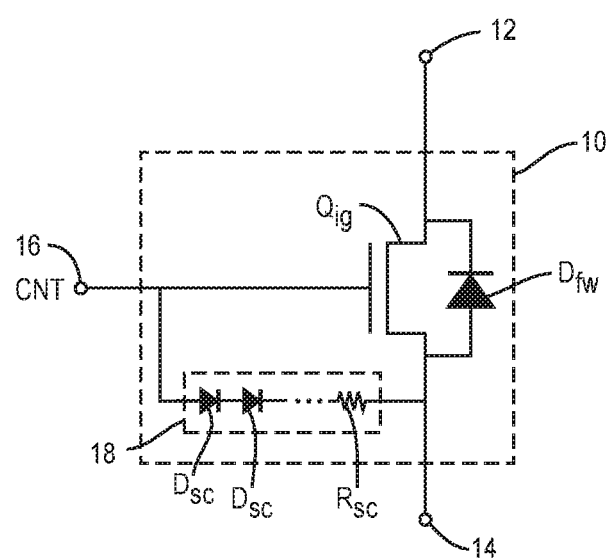
FIG. 6 is a schematic representation of a transistor semiconductor die according to one embodiment of the present disclosure.

FIG. 6 is a schematic representation of the transistor semiconductor die 10 according to an additional embodiment of the present disclosure. The transistor semiconductor die 10 shown in FIG. 6 is substantially similar to that shown in FIG. 2, except that the short circuit protection circuitry 18 further includes a short circuit protection resistive element $R_{sc}$ coupled in series with the short circuit protection diodes $D_{sc}$. The short circuit protection resistive element $R_{sc}$ may be used to achieve a precise voltage drop across the short circuit protection circuitry 18 that may be difficult to achieve using diodes alone. Since using only diodes in the short circuit protection circuitry 18 effectively limits the total voltage drop across the short circuit protection circuitry 18 to integer multiples of the forward voltage drop of the diodes, providing the short circuit protection resistive element $R_{sc}$ allows for more precise tuning of the voltage drop across the short circuit protection circuitry 18. The short circuit protection circuitry 18 may be provided with a negative temperature coefficient with respect to the resistance thereof, such that as the temperature of the transistor semiconductor die 10 increases, the resistance of the short circuit protection resistive element $R_{sc}$ decreases.

Figure 7:
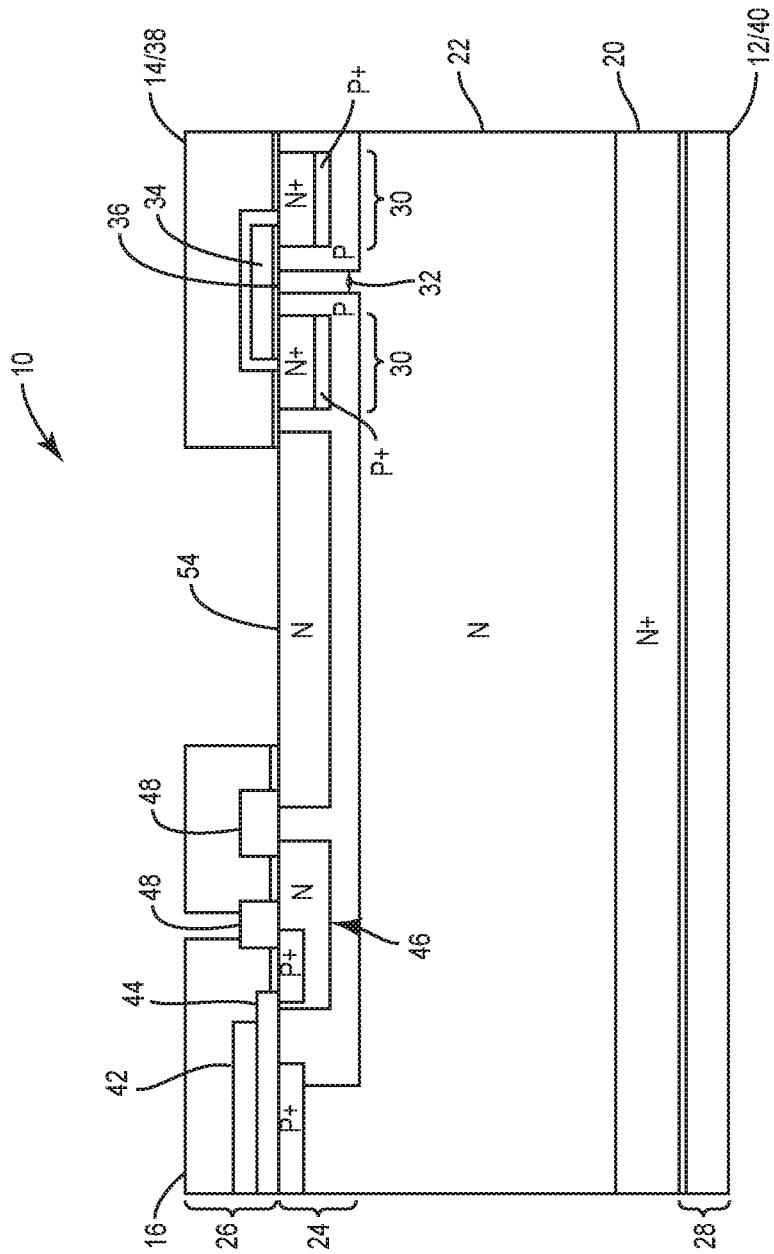
FIG. 7 is a cross-sectional view of a transistor semiconductor die according to one embodiment of the present disclosure.

FIG. 7 is a cross-sectional view of a portion of the transistor semiconductor die 10 according to an additional embodiment of the present disclosure. The transistor semiconductor die 10 shown in FIG. 7 is substantially similar to that shown in FIG. 4, except that the transistor semiconductor die 10 further includes the short circuit protection resistive element $R_{sc}$ coupled between the control terminal 16 and the second current terminal 14. The short circuit protection resistive element $R_{sc}$ may be implemented using a deep N-doped well 54. Providing the short circuit protection resistive element $R_{sc}$ in this manner may ensure a negative temperature coefficient with respect to resistance. While not shown, in other embodiments, the short circuit protection resistive element $R_{sc}$ may be implemented using a highly doped polysilicon resistor, a metal resistor with sufficiently high positive temperature coefficient with respect to resistance, or any other suitable type of resistive element.

Figure 8:
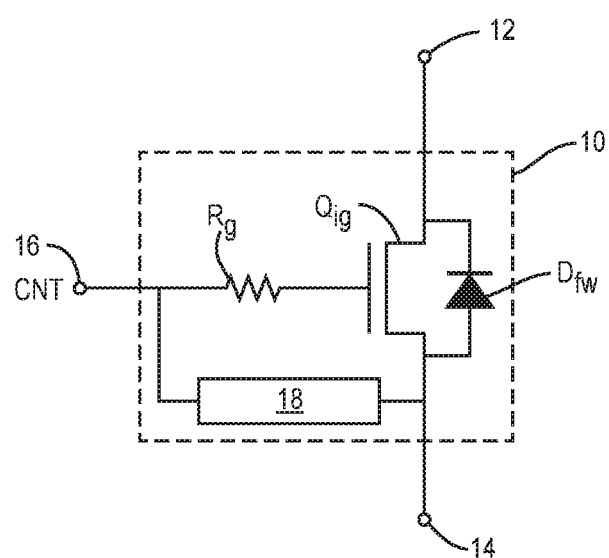
FIG. 8 is a schematic representation of a transistor semiconductor die according to one embodiment of the present disclosure.

FIG. 8 is a schematic representation of the transistor semiconductor die 10 according to an additional embodiment of the present disclosure. The transistor semiconductor die 10 shown in FIG. 8 is substantially similar to that shown in FIG. 1, except that the transistor semiconductor die 10 further includes a gate resistive element $R_g$ coupled between the control terminal 16 and a gate of the transistor device $Q_{ig}$. The gate resistive element $R_g$ is provided with a positive temperature coefficient with respect to a resistance thereof. In other words, a resistance of the gate resistive element $R_g$ increases as a temperature of the transistor semiconductor die 10 increases. Note that this functionality requires adequate thermal coupling between the short circuit protection circuitry 18 and the current carrying portion of the transistor semiconductor die 10. This may reduce a gate drive current in the event of a short circuit event, thereby enhancing the action of the short circuit protection circuitry 18.

Figure 9:
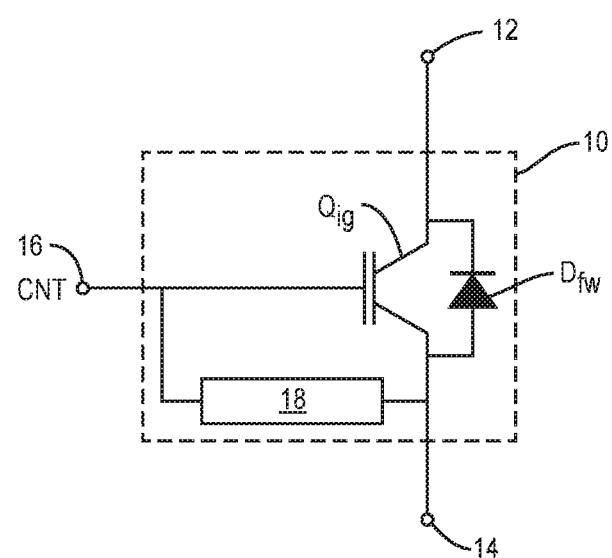
FIG. 9 is a schematic representation of a transistor semiconductor die according to one embodiment of the present disclosure.
Figure 10:
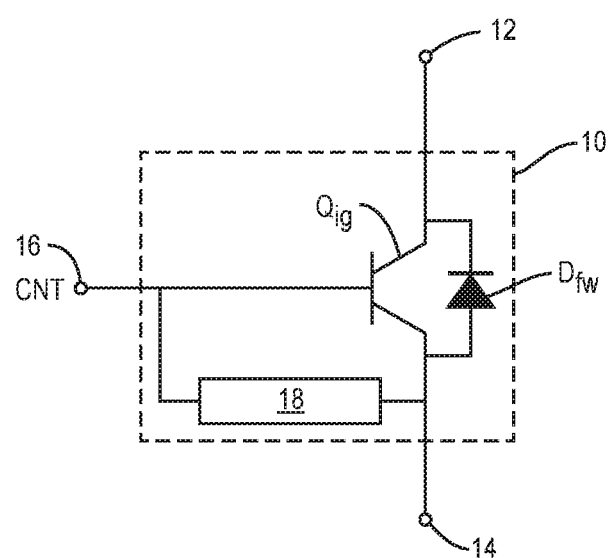
FIG. 10 is a schematic representation of a transistor semiconductor die according to one embodiment of the present disclosure.
Figure 11:
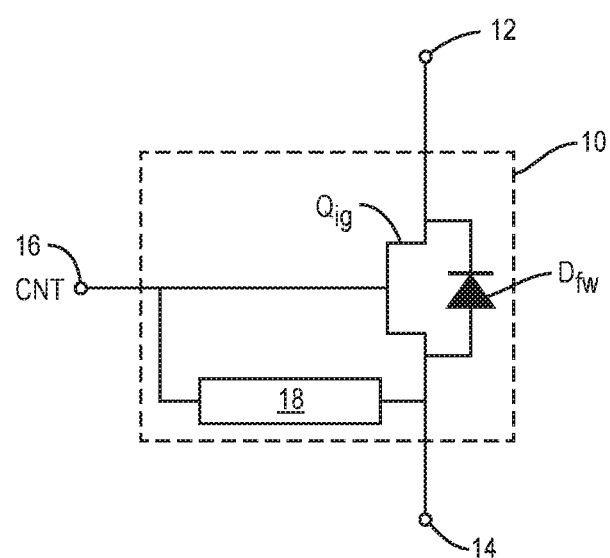
FIG. 11 is a schematic representation of a transistor semiconductor die according to one embodiment of the present disclosure.

As discussed above, while the foregoing examples of transistor semiconductor die 10 are primarily shown depicting the transistor device $Q_{ig}$ as a MOSFET, the principles of the present disclosure apply equally to any type of transistor devices including IGBTs, BJTs, JFETs, and the like. Accordingly, for the sake of completeness FIG. 9 shows a schematic view of the transistor semiconductor die 10 wherein the transistor device $Q_{ig}$ is an IGBT instead of a MOSFET. In this case, the first current terminal 12 is a collector terminal and the second current terminal 14 is an emitter terminal. Those skilled in the art will readily appreciate that the MOSFET depicted in the cross-sectional views of the transistor semiconductor die 10 shown above can be readily replaced with an IGBT, for example, by adding an injector layer between the substrate 20 and the drift layer 22. FIG. 10 shows a schematic view of the transistor semiconductor die 10 wherein the transistor device $Q_{ig}$ is a BJT instead of a MOSFET. In this case, the first current terminal 12 is a collector terminal, the second current terminal 14 is an emitter terminal, and the control terminal 14 is a base terminal. Those skilled in the art will readily appreciate that the MOSFET depicted in the cross-sectional views of the transistor semiconductor die 10 shown above can be readily replaced with a BJT. FIG. 11 shows a schematic view the transistor semiconductor die 10 wherein the transistor device $Q_{ig}$ is a JFET instead of a MOSFET. In this case, the first current terminal 12 is a drain terminal, the second current terminal 14 is a source terminal, and the control terminal 16 is a gate terminal. Those skilled in the art will readily appreciate that the MOSFET depicted in the cross-sectional views of the transistor semiconductor die 10 shown above can be readily replaced with a JFET.

Those skilled in the art will recognize improvements and modifications to the preferred embodiments of the present disclosure. All such improvements and modifications are considered within the scope of the concepts disclosed herein and the claims that follow.

What is claimed is:

1. A transistor semiconductor die comprising:
   a first current terminal and a second current terminal;
   a control terminal;
   a semiconductor structure comprising a drift layer, wherein the semiconductor structure is between the first current terminal, the second current terminal, and the control terminal, the semiconductor structure configured such that a resistance between the first current terminal and the second current terminal is based on a control signal provided at the control terminal; and
   a short circuit protection circuitry comprising one or more diodes formed by implants that reside entirely within the drift layer, wherein the short circuit protection circuitry is coupled between the control terminal and the second current terminal such that an anode of the one or more diodes is coupled to the control terminal and the short circuit protection circuitry is configured to:
      in a normal mode of operation, provide a voltage drop between the control terminal and the second current terminal that is greater than a voltage of the control signal; and
      in a short circuit protection mode of operation, provide a voltage drop between the control terminal and the second current terminal that is less than a voltage of the control signal.

2. The transistor semiconductor die of claim 1 further comprising a resistive element coupled between the short circuit protection circuitry and the control terminal.

3. The transistor semiconductor die of claim 2 wherein:
   the one or more diodes have a negative temperature coefficient with respect to a voltage drop across the one or more diodes; and
   the resistive element has a positive temperature coefficient with respect to a resistance thereof.

4. The transistor semiconductor die of claim 1 wherein the one or more diodes have a negative temperature coefficient with respect to a voltage drop across the one or more diodes.

5. The transistor semiconductor die of claim 1 wherein the one or more diodes are coupled in series such that an anode of a first one of the one or more diodes is coupled to the control terminal and a cathode of a last one of the one or more diodes is coupled to the second current terminal.

6. The transistor semiconductor die of claim 5 wherein the one or more diodes are PN diodes.

7. The transistor semiconductor die of claim 5 wherein the one or more diodes are Schottky diodes.

8. The transistor semiconductor die of claim 1 wherein the semiconductor structure comprises silicon carbide.

9. The transistor semiconductor die of claim 8 wherein the semiconductor structure provides a metal-oxide semiconductor field-effect transistor (MOSFET) such that the first current terminal is a drain terminal and the second current terminal is a source terminal.

10. The transistor semiconductor die of claim 8 wherein the semiconductor structure provides an insulated gate bipolar transistor (IGBT) such that the first current terminal is a collector terminal and the second current terminal is an emitter terminal.

11. The transistor semiconductor die of claim 1 wherein:
    the transistor semiconductor die is configured to operate in the normal mode of operation when a temperature of the semiconductor structure is below a short circuit threshold temperature; and
    the transistor semiconductor die is configured to operate in the short circuit protection mode of operation when a temperature of the semiconductor structure is above the short circuit threshold temperature.

12. The transistor semiconductor die of claim 1 wherein the voltage drop between the control terminal and the second current terminal provided by the short circuit protection circuitry has a negative temperature coefficient.

13. The transistor semiconductor die of claim 1 wherein an on-state resistance of the transistor semiconductor die is less than 3.0 mΩ/cm$^2$, a blocking voltage of the transistor semiconductor die is greater than 600 V, and a short circuit withstand time of the transistor semiconductor die is greater than 3 µs.

14. The transistor semiconductor die of claim 13 wherein the on-state resistance of the transistor semiconductor die is greater than 0.1 mΩ/cm$^2$, the blocking voltage of the transistor semiconductor die is less than 10 kV, and a short circuit withstand time of the transistor semiconductor die is less than 10 s.

15. A transistor semiconductor die comprising:
    a first current terminal and a second current terminal;
    a control terminal; and
    a semiconductor structure between the first current terminal, the second current terminal, and the control terminal, the semiconductor structure comprising a short circuit protection circuitry comprising a plurality of diodes formed by implants that reside entirely within a drift layer of the semiconductor structure, wherein the semiconductor structure is configured such that a resistance between the first current terminal and the second current terminal is based on a control signal provided at the control terminal, an on-state resistance of the transistor semiconductor die is less than 3.0 mΩ/cm$^2$, a blocking voltage of the transistor semiconductor die is greater than 600 V, and a short circuit withstand time of the transistor semiconductor die is greater than 3 µs.

16. The transistor semiconductor die of claim 15 wherein the on-state resistance of the transistor semiconductor die is greater than 0.1 mΩ/cm$^2$, the blocking voltage of the transistor semiconductor die is less than 10 kV, and the short circuit withstand time of the transistor semiconductor die is less than 10 s.

17. A transistor semiconductor die comprising:
a first current terminal and a second current terminal;
a control terminal;
a semiconductor structure between the first current terminal, the second current terminal, and the control terminal, the semiconductor structure configured such that a resistance between the first current terminal and the second current terminal is based on a control signal provided at the control terminal; and
a short circuit protection circuitry comprising a plurality of diodes formed by implants that resides entirely within a drift layer of the semiconductor structure, wherein the the plurality of diodes coupled in series between the control terminal and the second current terminal such that an anode of the plurality of diodes is coupled to the control terminal.

18. The transistor semiconductor die of claim 17 wherein the plurality of diodes are coupled in series such that an anode of a first one of the plurality of diodes is coupled to the control terminal, a cathode of a last one of the plurality of diodes is coupled to the second current terminal, and each adjacent pair of diodes in the plurality of diodes is coupled anode-to-cathode.

19. The transistor semiconductor die of claim 18 further comprising a resistive element coupled between the cathode of the last one of the plurality of diodes and the second current terminal.

20. The transistor semiconductor die of claim 19 wherein:
the plurality of diodes have a negative temperature coefficient with respect to a voltage drop across the plurality of diodes; and
the resistive element has a negative temperature coefficient with respect to a resistance thereof.

21. The transistor semiconductor die of claim 17 wherein the plurality of diodes are coupled in series such that a cathode of a first one of the plurality of diodes is coupled to the control terminal, an anode of a last one of the plurality of diodes is coupled to the second current terminal, and each adjacent pair of diodes in the plurality of diodes is coupled anode-to-cathode.

22. The transistor semiconductor die of claim 19 wherein the plurality of diodes are Zener diodes.

23. The transistor semiconductor die of claim 21 further comprising a resistive element coupled between the anode of the last one of the diodes and the second current terminal.

24. The transistor semiconductor die of claim 23 wherein:
the plurality of diodes have a negative temperature coefficient with respect to a voltage drop across the plurality of diodes; and
the resistive element has a positive temperature coefficient with respect to a resistance thereof.

25. The transistor semiconductor die of claim 17 further comprising a resistive element coupled between the short circuit protection circuitry and the control terminal.

26. The transistor semiconductor die of claim 25 wherein:
the plurality of diodes have a negative temperature coefficient with respect to a voltage drop across the plurality of diodes; and
the resistive element has a positive temperature coefficient with respect to a resistance thereof.

* * * * *

UNITED STATES PATENT AND TRADEMARK OFFICE
CERTIFICATE OF CORRECTION

PATENT NO. : 11,579,645 B2
APPLICATION NO. : 16/448538
DATED : February 14, 2023
INVENTOR(S) : Richmond et al.

Page 1 of 2

It is certified that error appears in the above-identified patent and that said Letters Patent is hereby corrected as shown below:

On the Title Page

(54) Title: Please correct "SHORT-CIRCUITRY" to read --SHORT-CIRCUIT--

(56) References Cited; FOREIGN PATENT DOCUMENTS: Please add the following: --EP 0437939 7/1991--

In the Specification

Column 1, Line 1: Please correct "SHORT-CIRCUITRY" to read --SHORT-CIRCUIT--

Column 6, Line 2: Please correct "0.1 mΩ/cm$^2$" to read --0.1mΩ/cm$^2$--

Column 6, Lines 2-3: Please correct "3.0 mΩ/cm$^2$" to read --3.0mΩ/cm$^2$--

Column 6, Line 4: Please correct "10 kV" to read --10kV--

Column 6, Line 6: Please correct "3 μs" to read --3μs--

Column 6, Line 8: Please correct "0.5 mΩ/cm$^2$" to read --0.5mΩ/cm$^2$--

Column 6, Line 8: Please correct "3.0 mΩ/cm$^2$" to read --3.0mΩ/cm$^2$--

Column 6, Line 9: Please correct "1.0 mΩ/cm$^2$" to read --1.0mΩ/cm$^2$--

Column 6, Line 9: Please correct "3.0 mΩ/cm$^2$" to read --3.0mΩ/cm$^2$--

Column 6, Line 9: Please correct "1.5 mΩ/cm$^2$" to read --1.5mΩ/cm$^2$--

Column 6, Line 10: Please correct "3.0 mΩ/cm$^2$, between 2.0 mΩ/cm$^2$ and 3.0 mΩ/cm$^2$," to read Signed and Sealed this
Twentieth Day of June, 2023

Katherine Kelly Vidal
*Director of the United States Patent and Trademark Office*

--3.0mΩ/cm², between 2.0mΩ/cm² and 3.0mΩ/cm²,--

Column 6, Line 11: Please correct "2.5 mΩ/cm²" to read --2.5mΩ/cm²--

Column 6, Line 11: Please correct "3.0 mΩ/cm²" to read --3.0mΩ/cm²--

Column 6, Line 14: Please correct "1 kV" to read --1kV--

Column 6, Line 14: Please correct "2 kV" to read --2kV--

Column 6, Lines 15-16: Please correct "5 kV, between 1 kV and 5 kV, between 5 kV and 10 kV" to read --5kV, between 1kV and 5kV, between 5kV and 10kV--

Column 6, Lines 32-35: Please correct "4 μs and 10 s, between 5 μs and 10 s, between 10 μs and 10 s, between 50 μs and 10 s, between 5 ms and 10 s, between 10 ms and 10 s, between 50 ms and 10 s, between 1 s and 10 s" to read --4μs and 10s, between 5μs and 10s, between 10μs and 10s, between 50μs and 10s, between 5ms and 10s, between 10ms and 10s, between 50ms and 10s, between 1s and 10s--

In the Claims

Column 10, Line 35, Claim 13: Please correct "3.0 mΩ/cm²" to read --3.0mΩ/cm²--

Column 10, Line 36, Claim 13: Please correct "600 V" to read --600V--

Column 10, Line 38, Claim 13: Please correct "3 μs" to read --3μs--

Column 10, Line 41, Claim 14: Please correct "0.1 mΩ/cm²" to read --0.1mΩ/cm²--

Column 10, Line 42, Claim 14: Please correct "10 kV" to read --10kV--

Column 10, Line 44, Claim 14: Please correct "10 s" to read --10s--

Column 10, Line 58, Claim 15: Please correct "3.0 mΩ/cm²" to read --3.0mΩ/cm²--

Column 10, Line 60, Claim 15: Please correct "600 V" to read --600V--

Column 10, Line 61, Claim 15: Please correct "3 μs" to read --3μs--

Column 10, Line 64, Claim 16: Please correct "0.1 mΩ/cm²" to read --0.1mΩ/cm²--

Column 10, Line 65, Claim 16: Please correct "10 kV" to read --10kV--

Column 10, Line 67, Claim 16: Please correct "10 s" to read --10s--